(12) United States Patent
Brown

(10) Patent No.: US 6,380,026 B2
(45) Date of Patent: Apr. 30, 2002

(54) PROCESSING METHODS OF FORMING INTEGRATED CIRCUITRY MEMORY DEVICES, METHODS OF FORMING DRAM ARRAYS, AND RELATED SEMICONDUCTOR MASKS

(75) Inventor: Kris K. Brown, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/789,337

(22) Filed: Feb. 20, 2001

Related U.S. Application Data

(63) Continuation of application No. 09/447,728, filed on Nov. 22, 1999, now Pat. No. 6,235,578, which is a continuation of application No. 08/918,657, filed on Aug. 22, 1997, now Pat. No. 6,025,221.

(51) Int. Cl.[7] .......................................... H01L 21/8242
(52) U.S. Cl. ...................................... 438/238; 438/253
(58) Field of Search ................................ 438/238–240, 438/253–256, 235, 396–399

(56) References Cited

U.S. PATENT DOCUMENTS

| | | | |
|---|---|---|---|
| 4,994,893 A | 2/1991 | Ozaki et al. | |
| 5,248,628 A | 9/1993 | Okabe et al. | |
| 5,279,989 A | 1/1994 | Kim | |
| 5,536,672 A | 7/1996 | Miller et al. | |
| 5,581,093 A | * 12/1996 | Sakamoto | 257/382 |
| 5,604,147 A | 2/1997 | Fischer et al. | |
| 5,763,286 A | 6/1998 | Figura et al. | |
| 5,789,304 A | 8/1998 | Fischer et al. | |
| 5,792,687 A | 8/1998 | Jeng et al. | |
| 5,940,676 A | 8/1999 | Fazan et al. | |

FOREIGN PATENT DOCUMENTS

| | | |
|---|---|---|
| DE | 4028488 | 3/1991 |
| DE | WO 94/00875 | 1/1994 |
| EP | 0 756 327 | 1/1997 |
| JP | 03 205868 | 9/1991 |
| JP | 08 078640 | 3/1996 |

* cited by examiner

Primary Examiner—Jey Tsai

(57) ABSTRACT

Methods of forming integrated circuitry memory devices are described. In a preferred implementation, methods of forming DRAM arrays are described. According to one aspect of the invention, a plurality of continuous active areas are formed relative to a semiconductive substrate. A plurality of word lines and active area isolation lines are formed over the continuous active areas. An insulative layer is formed over the word lines and active area isolation lines and in a common masking step, both capacitor contact openings and bit line contact openings are patterned over the insulative layer. Subsequently, capacitor contact openings and bit line contact openings are etched through the insulative layer over the continuous active area. In a preferred implementation, the capacitor contact openings and the bit line contact openings are contemporaneously patterned and etched. Subsequently, conductive material is formed within the openings to provide conductive plugs. Capacitors and bit lines are then formed to be in electrical communication with the respective conductive plugs within the respective capacitor contact openings or bit line contact openings.

27 Claims, 12 Drawing Sheets

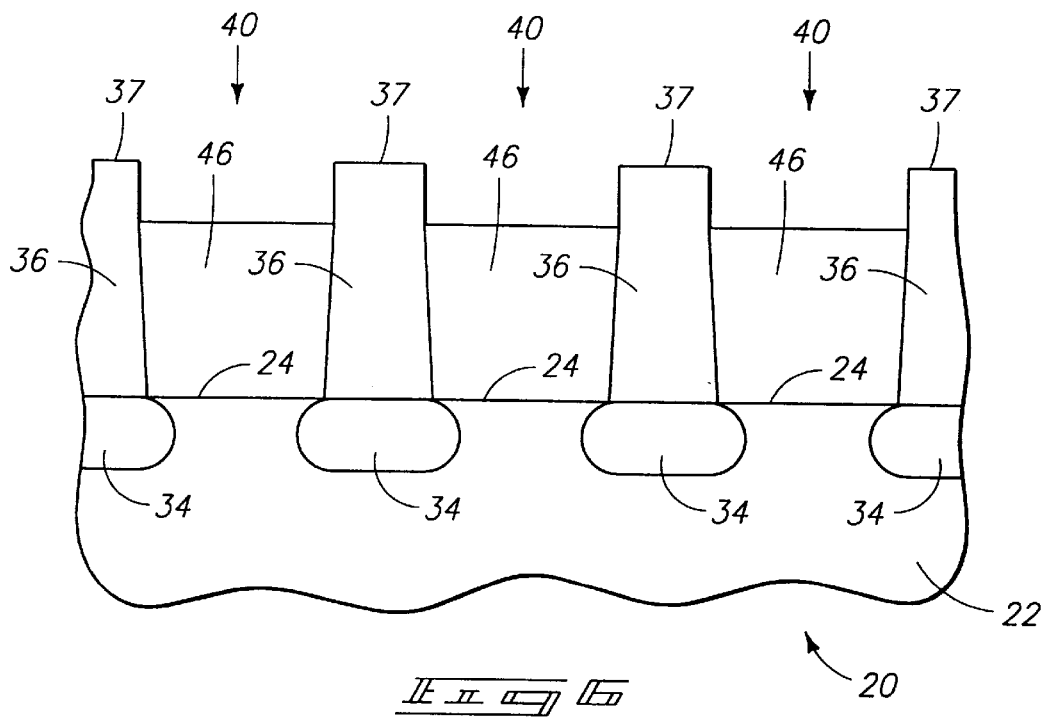
_FIG 6_
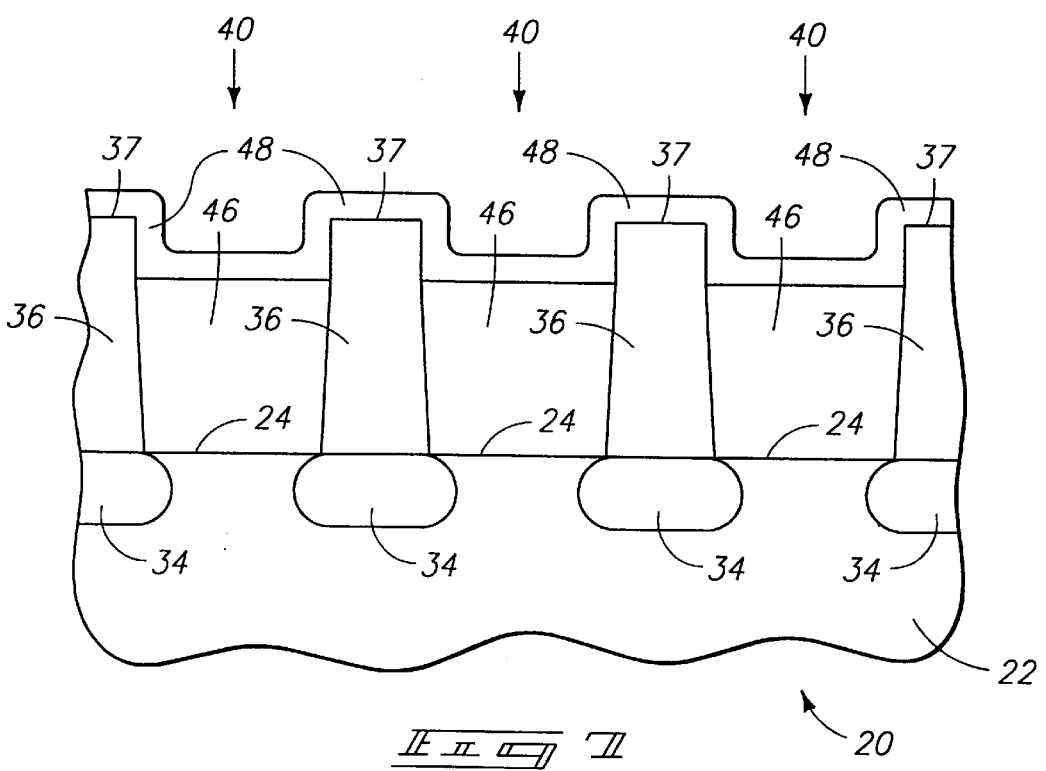
_FIG 7_

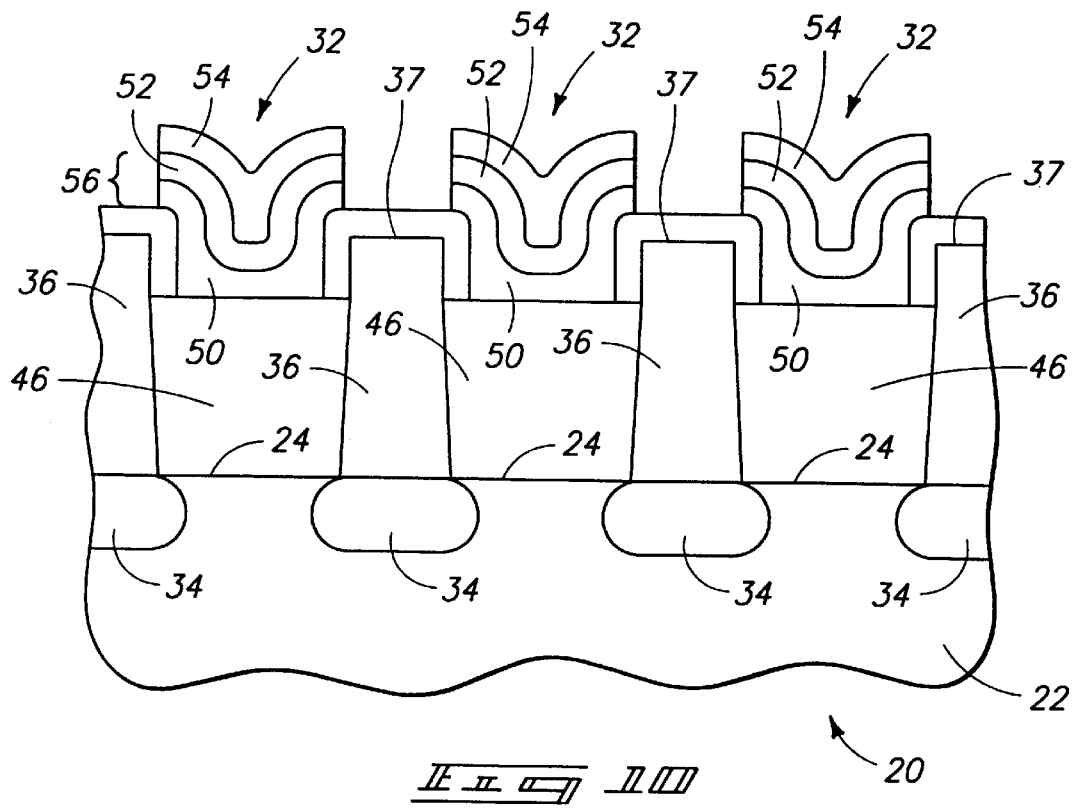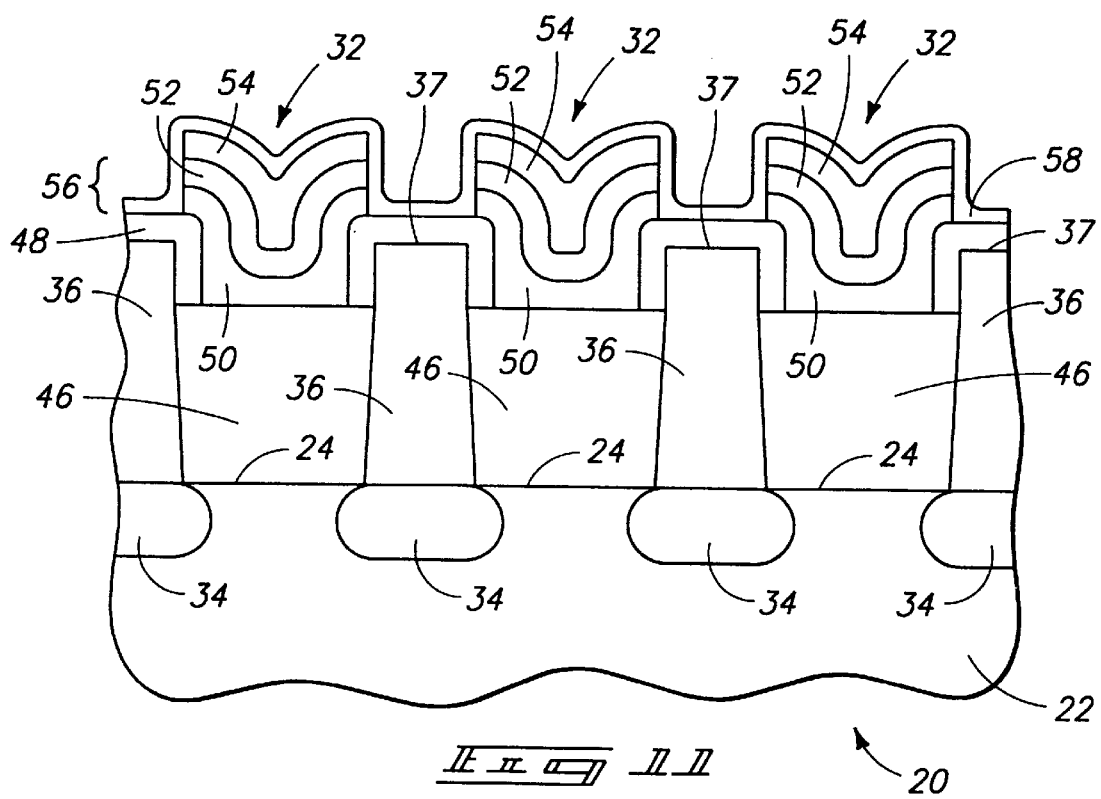

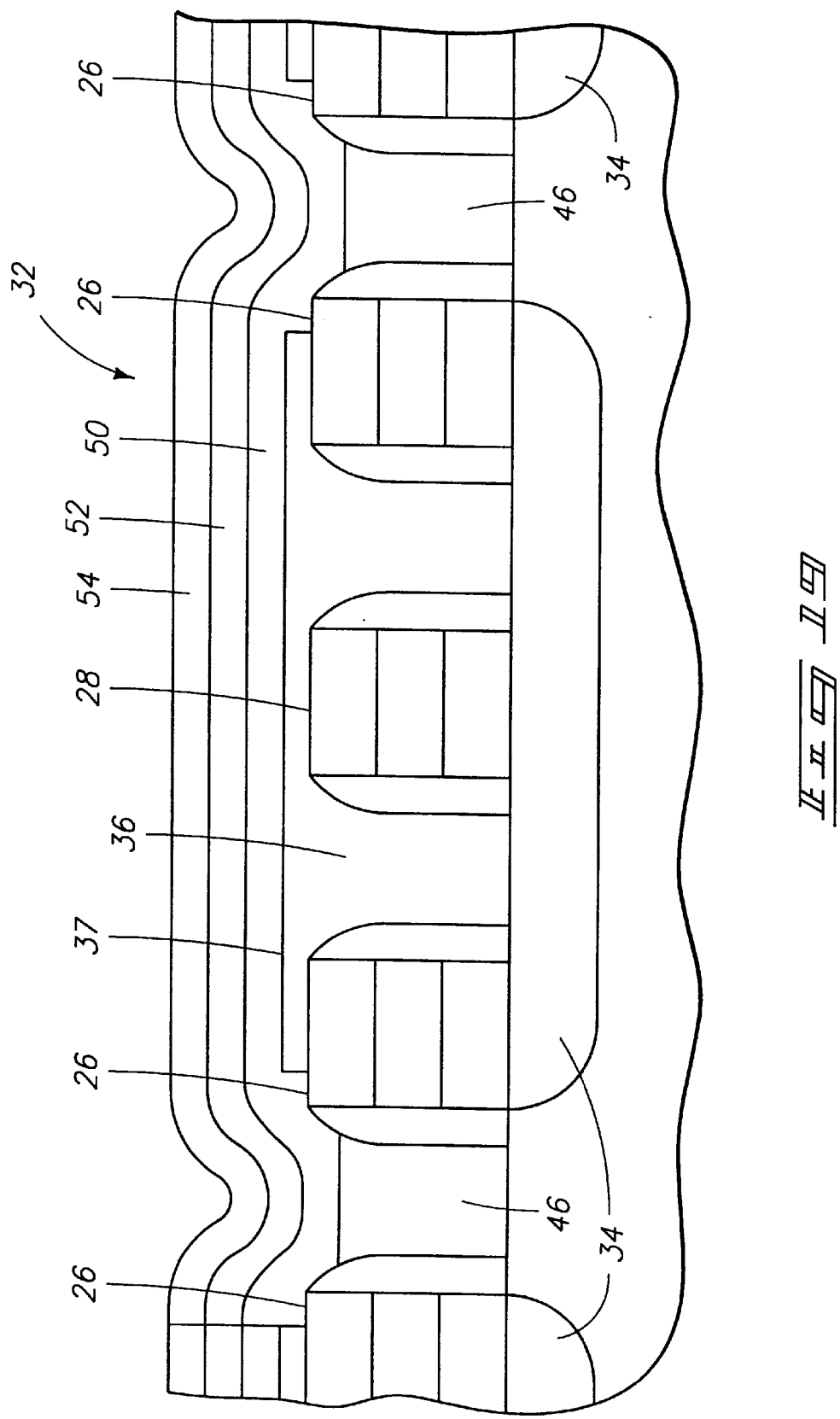

US 6,380,026 B2

PROCESSING METHODS OF FORMING INTEGRATED CIRCUITRY MEMORY DEVICES, METHODS OF FORMING DRAM ARRAYS, AND RELATED SEMICONDUCTOR MASKS

This patent application is a continuation application of U.S. patent application Ser. No. 09/447,728, filed on Nov. 22, 1999, now U.S. Pat. No. 6,235,578 which is a continuation application of U.S. patent application Ser. No. 08/918,657, filed on Aug. 22, 1997, now U.S. Pat. No. 6,025,221.

TECHNICAL FIELD

This invention relates to methods of forming integrated circuitry memory devices, to methods of forming dynamic random access memory (DRAM) device arrays, and to semiconductor masks.

BACKGROUND OF THE INVENTION

Processing of semiconductor devices typically involves many steps in which layers of material are formed over a substrate and subsequently patterned into a desired feature or structure. Typical features or structures include conductive lines and contact openings. Each time a patterning or etching step is conducted, certain risks arise which can jeopardize the integrity of a wafer being processed. For example, a mask misalignment error can cause a subsequent etch to undesirably etch into wafer or substrate structure which can cause catastrophic failure. Accordingly, a need exists to reduce the number of processing steps utilized in the formation of integrated circuitry.

This invention arose out of concerns associated with reducing the number of processing steps needed in the formation of integrated circuitry. This invention also arose out of concerns associated with improving the manner in which integrated circuitry memory devices, and in particular DRAM devices are fabricated.

SUMMARY OF THE INVENTION

Methods of forming integrated circuitry memory devices are described. In a preferred implementation, methods of forming DRAM arrays are described. According to one aspect of the invention, a plurality of continuous active areas are formed relative to a semiconductive substrate. A plurality of word lines and active area isolation lines are formed over the continuous active areas. An insulative layer is formed over the word lines and active area isolation lines and in a common masking step, both capacitor contact openings and bit line contact openings are patterned over the insulative layer. Subsequently, capacitor contact openings and bit line contact openings are etched through the insulative layer over the continuous active area. In a preferred implementation, the capacitor contact openings and the bit line contact openings are contemporaneously patterned and etched. Subsequently, conductive material is formed within the openings to provide conductive plugs. Capacitors and bit lines are then formed to be in electrical communication with the respective conductive plugs within the respective capacitor contact openings or bit line contact openings.

BRIEF DESCRIPTION OF THE DRAWINGS

Preferred embodiments of the invention are described below with reference to the following accompanying drawings.

FIG. 6 is a view of the FIG. 2 wafer fragment at another processing step.

FIG. 7 is a view of the FIG. 2 wafer fragment at another processing step.

FIG. 10 is a view of the FIG. 2 wafer fragment at another processing step.

FIG. 11 is a view of the FIG. 2 wafer fragment at another processing step.

FIG. 19 is a slightly enlarged view of the FIG. 1 wafer which is taken along line 19—19 in FIG. 1.

DETAILED DESCRIPTION OF THE PREFERRED EMBODIMENTS

Figure 1:
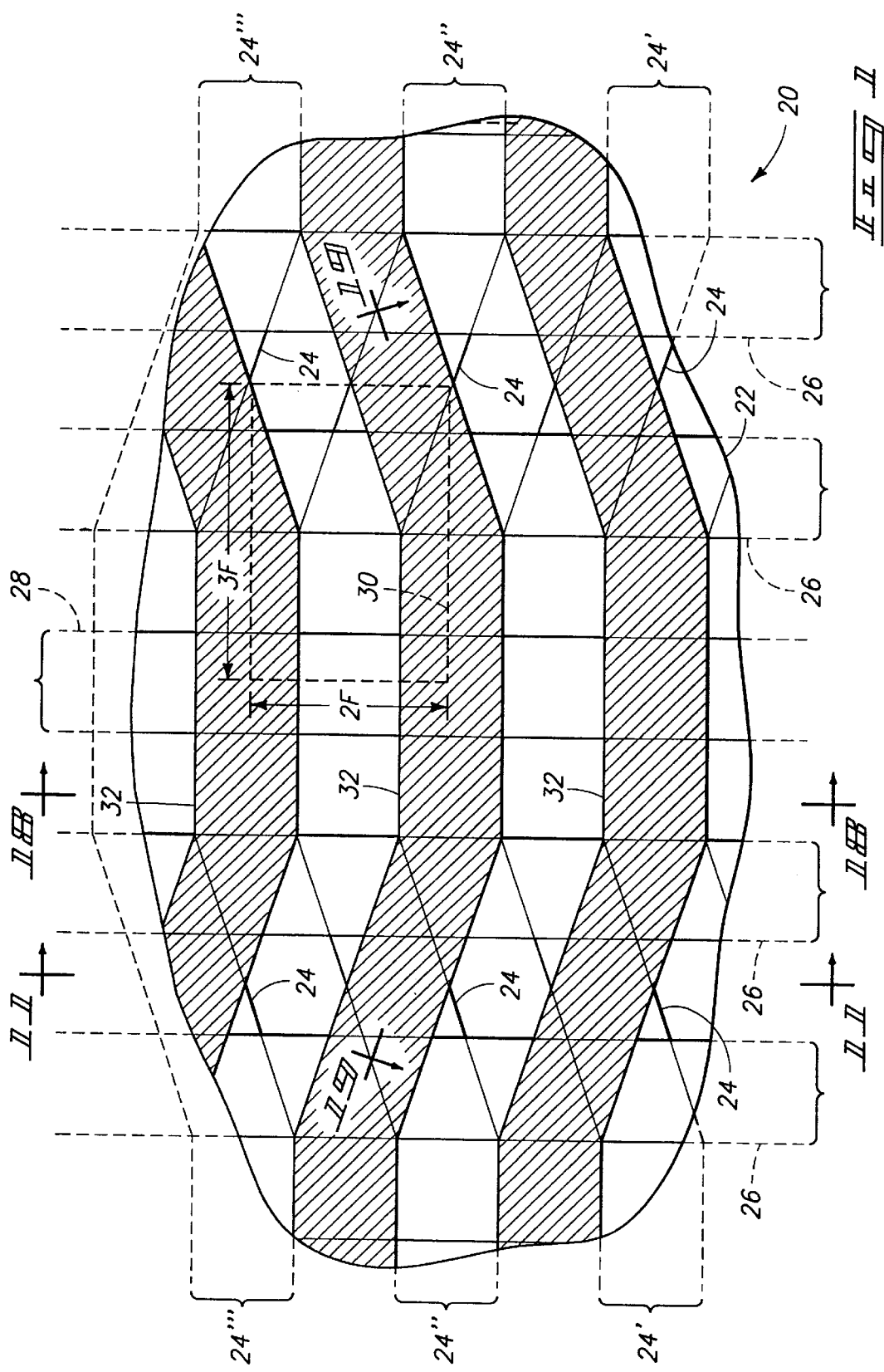
FIG. 1 is a top view of a semiconductor wafer fragment undergoing processing in accordance with the invention.

Referring to FIG. 1, a fragmentary portion of a semiconductor wafer in process is indicated generally by reference numeral 20 and includes a semiconductive substrate 22. As used in this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the "semiconductive substrates" described above.

A plurality of continuous active areas 24 are formed relative to substrate 22. For the purposes of clarity, each illustrated continuous active area has been shown to extend to outside of the boundary of substrate 22 utilizing dashed lines. Each individual active area is designated separately as 24', 24", and 24'". In accordance with one aspect of the invention, continuous active areas 24', 24", and 24'" are not straight or linear, but rather bend or serpentine relative to the substrate within which they are formed. The illustrated individual continuous active areas extend generally horizontally across the page upon which FIG. 1 appears, and bend or jog upwardly as depicted in FIG. 1. A plurality of conductive lines 26, 28 are formed over substrate 22 relative to active areas 24. In the illustrated example, four of the conductive lines are designated with numeral 26 and one of the conductive lines is designated with numeral 28. A pair of conductive lines 26 may be seen on either side of conductive line 28. Conductive lines 26, 28 run generally vertically as viewed in FIG. 1. Active areas 24 and conductive lines 26, 28 constitute or define an array over which a plurality of memory cells will be formed. The array, in the preferred embodiment, constitutes a dynamic random access memory (DRAM) array. Individual areas which are consumed by single memory cells in accordance with this embodiment are illustrated by dashed outline at 30. Such area can be considered or described as relative to a dimension "F". In the illustrated example, "F" equals one-half of the "minimum pitch" of the memory array. The term "minimum pitch," in turn, will be understood within the context of this document, to be about equal to the smallest distance of a line width (such as lines 26, 28) plus the width of a space immediately adjacent the line on one side of the line between the line and a next adjacent line in a repeated pattern within the array. As shown, a single memory cell is about 3F wide by about 2F deep, thus providing a consumed area for a single memory cell of about $6F^2$. In a preferred implementation, "F" is no greater than 0.25 micron, and even more preferably, no greater than 0.18 micron.

In a preferred implementation, selected individual conductive lines provide electrical isolation relative to selected adjacent memory cells. Exemplary conductive lines 26 serve as word lines relative to individual memory cells 30. Adjacent word lines 26 share an intervening bit contact of adjacent pairs of memory cells as will become apparent below. Electrical isolation between the adjacent pairs of memory cells is provided by intervening conductive line 28. Line 28, in operation, is connected with ground or a suitable negative voltage and effectively substitutes for the electrical isolation formerly provided by field oxide. A plurality of bit lines 32 are indicated in cross-hatching in FIG. 1.

Turning now to FIGS. 2–11, such is a view taken along line 11—11 in FIG. 1 at a processing point which is prior to the FIG. 1 construction.

Figure 2:
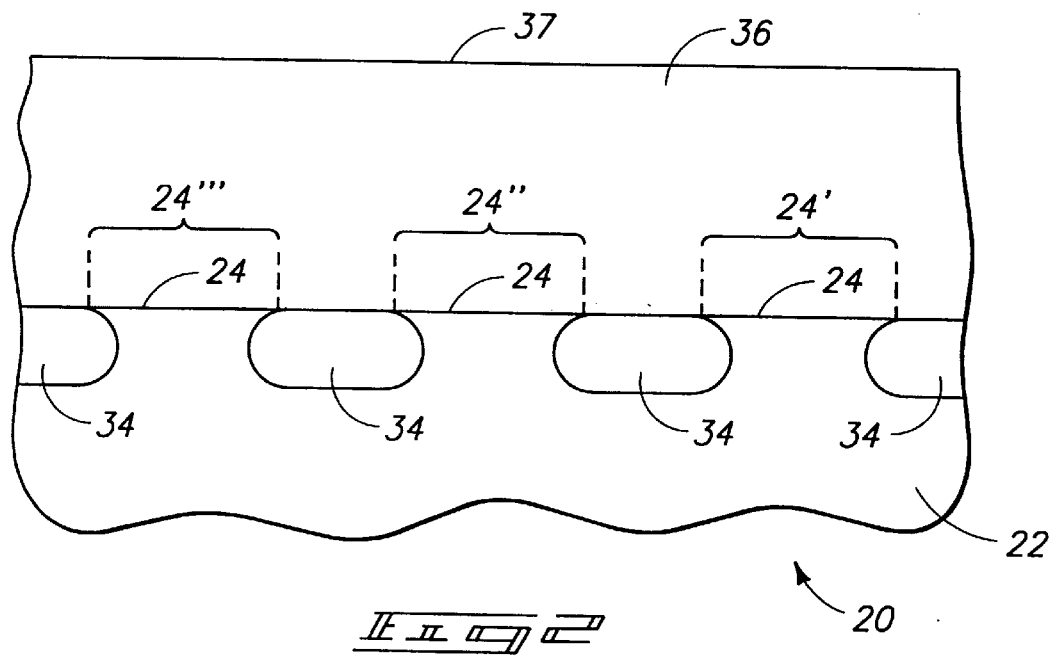
FIG. 2 is a diagrammatic sectional view of the FIG. 1 wafer fragment at one processing step in accordance with the invention. The FIG. 2 view is a view which is taken along line 11—11 in FIG. 1.

Referring to FIG. 2, a plurality of isolation oxide regions 34 are disposed relative to substrate 22. Regions 34 define, therebetween, continuous active areas 24. Individual continuous active areas 24', 24", and 24'" are indicated in their corresponding position relative to the FIG. 1 construction. A first insulative layer of material 36 is formed over substrate 22 and the array of continuous active areas 24. The first insulative layer is also formed over conductive lines 26, 28 (FIG. 1). Insulative layer 36 has an upper surface 37. An exemplary material for layer 36 is borophosphosilicate glass.

Figure 3:
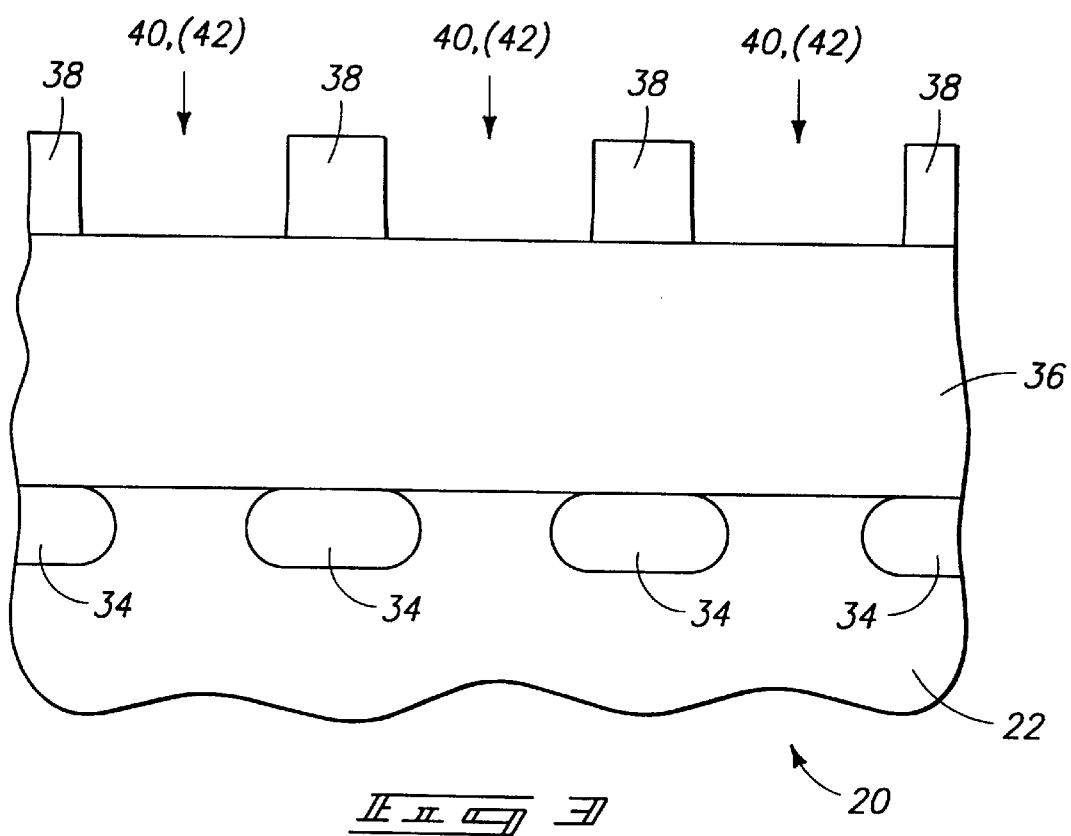
FIG. 3 is a view of the FIG. 2 wafer fragment at another processing step.

Referring to FIG. 3, a masking material layer or masking substrate such as photoresist is formed over substrate 22 and patterned to form blocks 38. The patterning of the masking material layer provides a single mask which defines plurality of patterned openings which are designated at 40(42). The significance of the parenthetical designation is to indicate that openings 40(42) are formed and collectively arranged to define a pattern of both bit line contact openings 40 and capacitor contact openings 42. Accordingly, both capacitor contact openings and bit line contact openings are patterned over insulative layer 36 in a common masking step.

Figure 4:
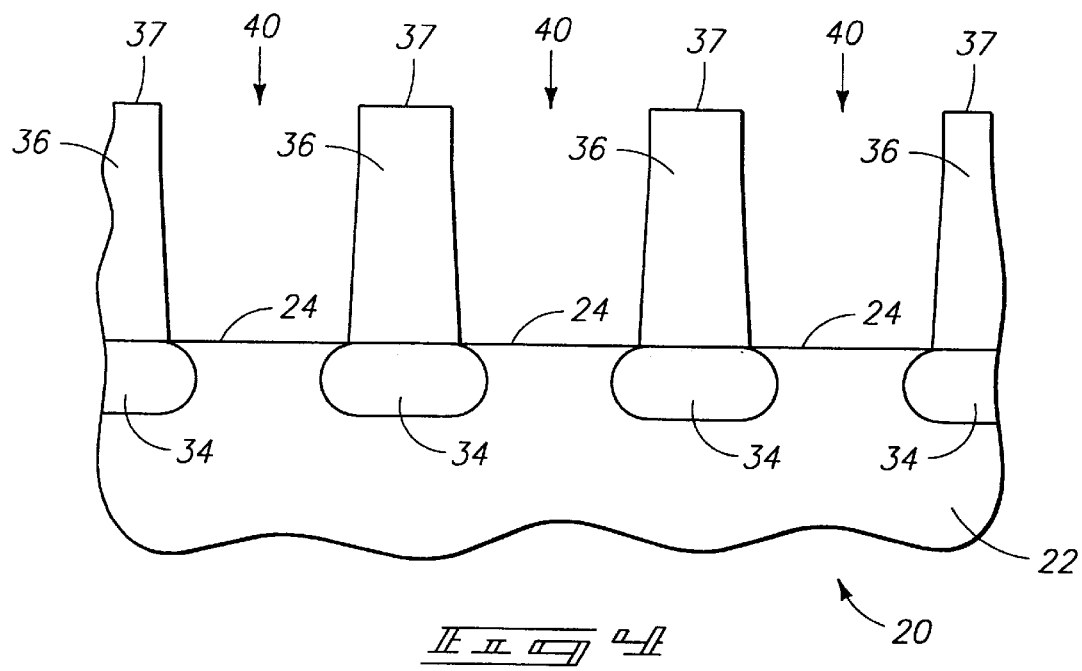
FIG. 4 is a view of the FIG. 2 wafer fragment at another processing step.

Referring to FIG. 4, openings are etched or otherwise formed in or through first insulative layer 36 to expose active area portions corresponding to the illustrated active areas 24. The exposing of the active area portions defines both capacitor contact openings and bit line contact openings for memory cells 30 (FIG. 1) which are to be formed. In accordance with one aspect, both the capacitor contact openings and the bit line contact openings are etched at the same time so that such openings are contemporaneously formed. Such openings, however, can be etched at different times. Preferably, the pattern which defines the layer 36 material to be etched or removed follows the corresponding continuous active areas. Blocks 38 are then stripped or otherwise removed. In one aspect, the stripping or removal of blocks 38 constitutes removing photoresist proximate the patterned bit line contact openings and capacitor contact openings in at least one common step.

Figure 5:
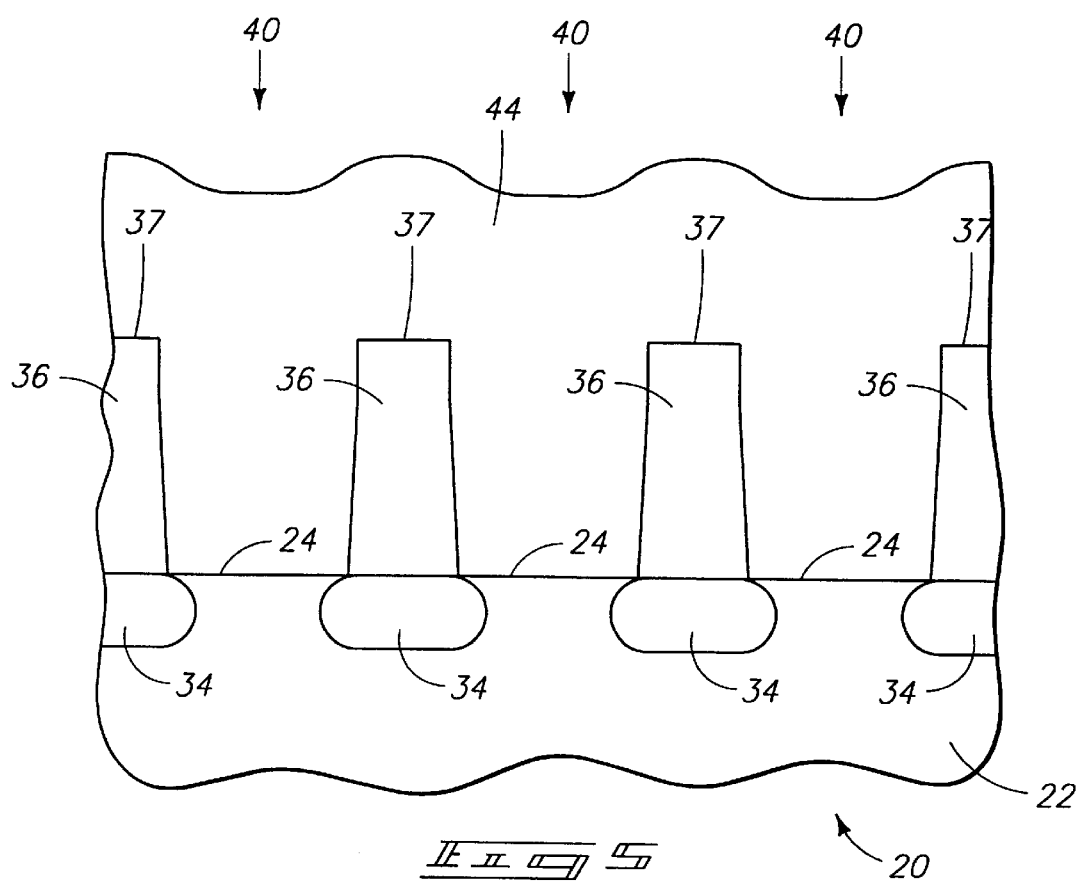
FIG. 5 is a view of the FIG. 2 wafer fragment at another processing step.

Referring to FIG. 5, a layer 44 of conductive material is formed over substrate 22 and the memory array. Preferably, layer 44 is formed within both the capacitor contact openings and the illustrated bit line contact openings 40. Such material is preferably in electrical communication with the associated active area portions over which it is formed. An exemplary material for layer 44 comprises conductively doped polysilicon.

Figure 12:
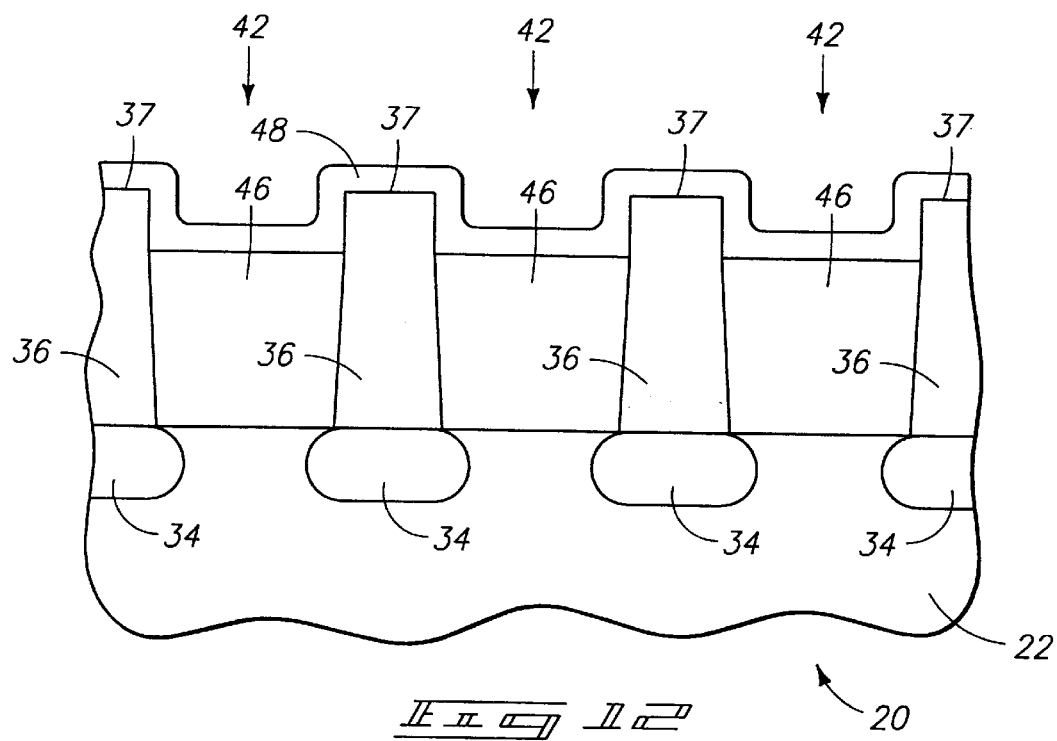
FIG. 12 is a view of the FIG. 2 wafer fragment which is taken along line 18—18 at a processing step which corresponds to the processing step shown in FIG. 7.

Referring to FIG. 6, material of layer 44 is removed to a degree sufficient to isolate conductive material plugs 46 within the openings formed in and relative to first insulative layer 36. The removal of layer 44 material can be accomplished by any suitable method which is effective to isolate the illustrated plugs 46. Such can include a resist etch back, a timed etch, or planarization relative to upper surface 37 of insulative layer 36. In accordance with a preferred aspect of the invention, layer 44 material is selectively removed relative to the insulative layer and to a degree sufficient to recess the conductive material to below the insulative layer upper surface 37. Such removal effectively forms isolated conductive material plugs 46 within the individual associated openings. Recessed conductive plugs 46 are shown in FIG. 12 and correspond to conductive plugs which are formed relative to and within capacitor contact openings 42. Preferably, all of such plugs of conductive material are in electrical communication with their associated substrate portions.

Referring to FIGS. 7 and 12, a layer 48 of second insulative material is formed over the array and preferably over all of the previously formed conductive plugs. Accordingly, layer 48 material is formed over and relative to bit line contact openings 40 and capacitor contact openings 42 (FIG. 12). An exemplary material for layer 48 is $SiO_2$. Other insulative materials can be used.

Figure 8B:
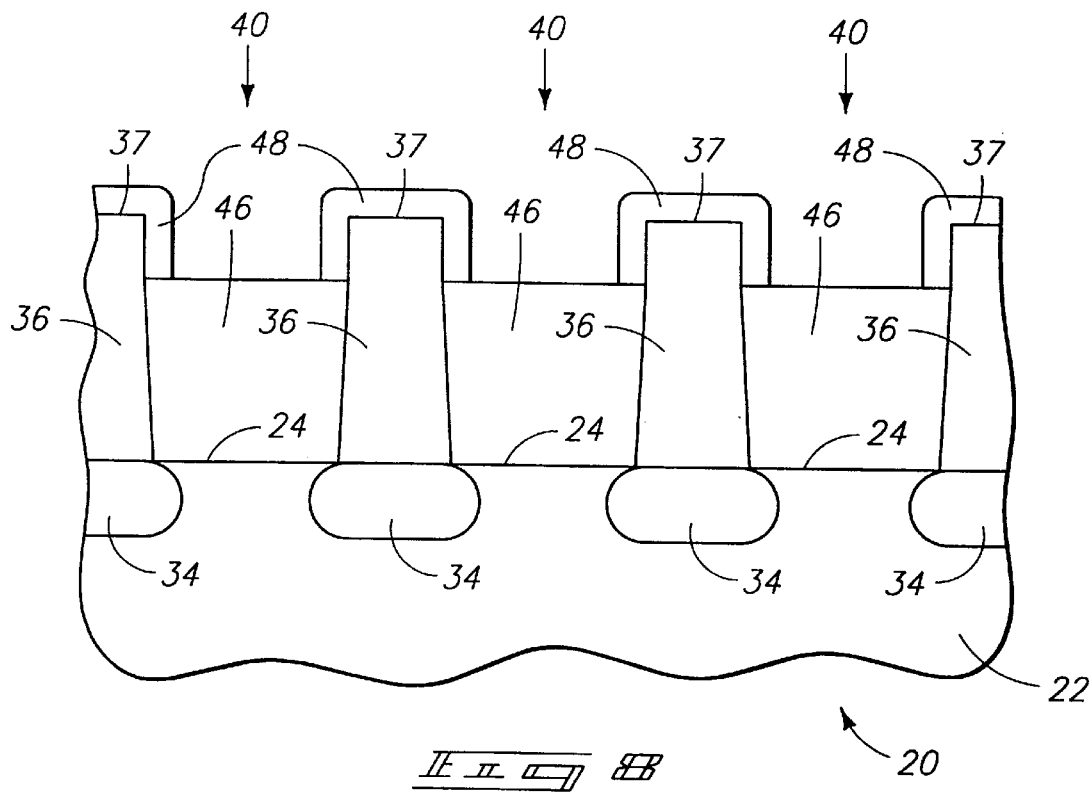
FIG. 8 is a view of the FIG. 2 wafer fragment at another processing step.

Referring to FIGS. 8 and 12, material of second insulative layer 48 is removed from only over bit line contact openings 40 (FIG. 8) to expose the associated plugs 46. Such can be accomplished by a suitable masked etch of the second insulative layer material from over bit line contact openings 40. Accordingly, as shown in FIG. 12, material of insulative layer 48 remains over the plugs 46 which are disposed within the capacitor contact openings 42. Such effectively electrically insulates the associated capacitor contact opening plugs during formation of buried bit or digit lines described just below.

Figure 9:
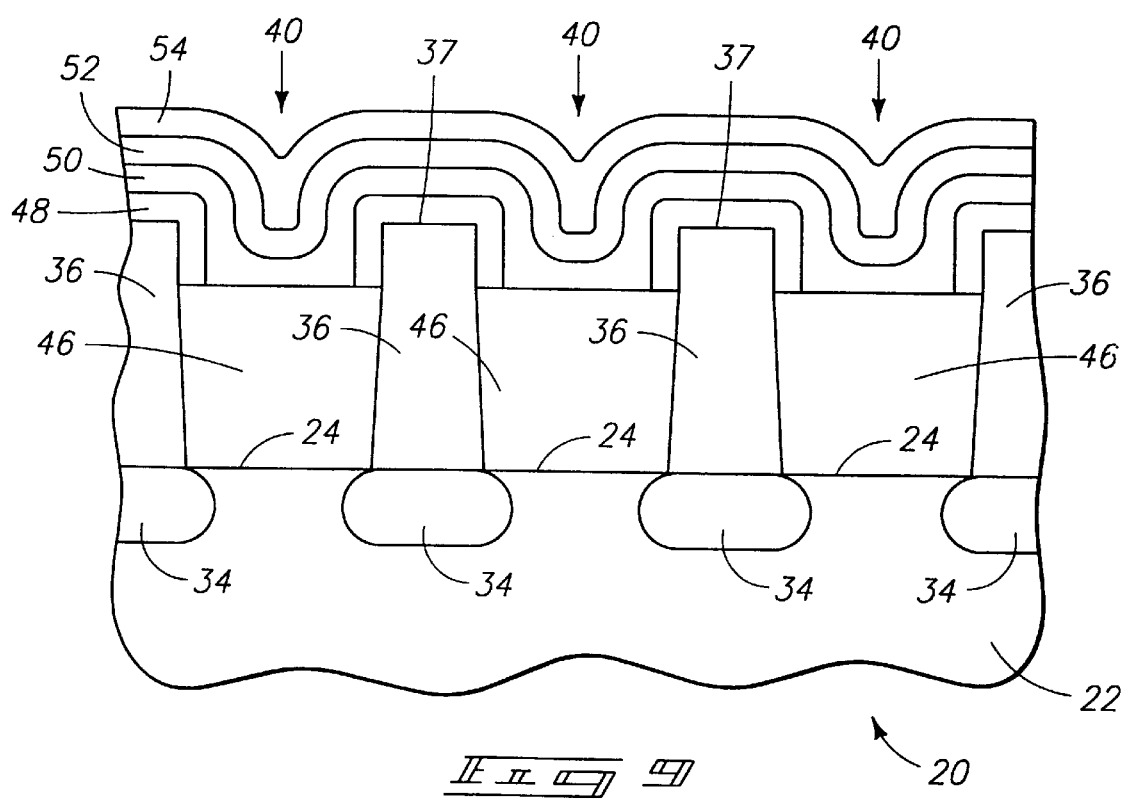
FIG. 9 is a view of the FIG. 2 wafer fragment at another processing step.
Figure 13:
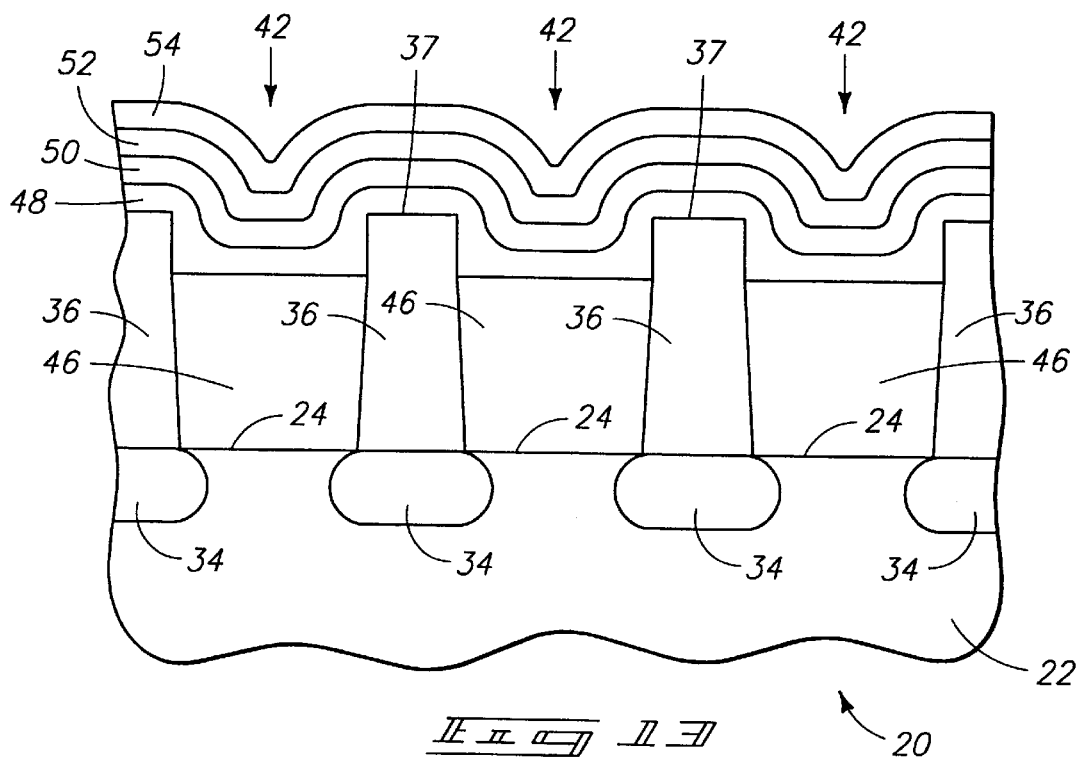
FIG. 13 is a view of the FIG. 2 wafer fragment at a processing step which corresponds to the processing step shown in FIG. 9.

Referring to FIGS. 9 and 13, various layers of material from which buried bit lines are to be formed are formed over the substrate. In a preferred implementation, a layer 50 of conductive material is formed over substrate 22. As shown in FIG. 9, layer 50 is in electrical communication with plugs 46. However, as shown in FIG. 13, layer 50 is electrically insulated from plugs 46 by second insulative material layer 48. An exemplary material for layer 50 is conductively doped polysilicon. A silicide layer 52 can be provided over layer 50. An exemplary material for layer 52 is $WSi_x$. A layer 54 of insulative material can be formed over layer 52. An exemplary material for layer 54 is an oxide material. The above constitutes but one way of forming the layers which comprise the bit lines. Other materials and layers are possible.

Figure 14:
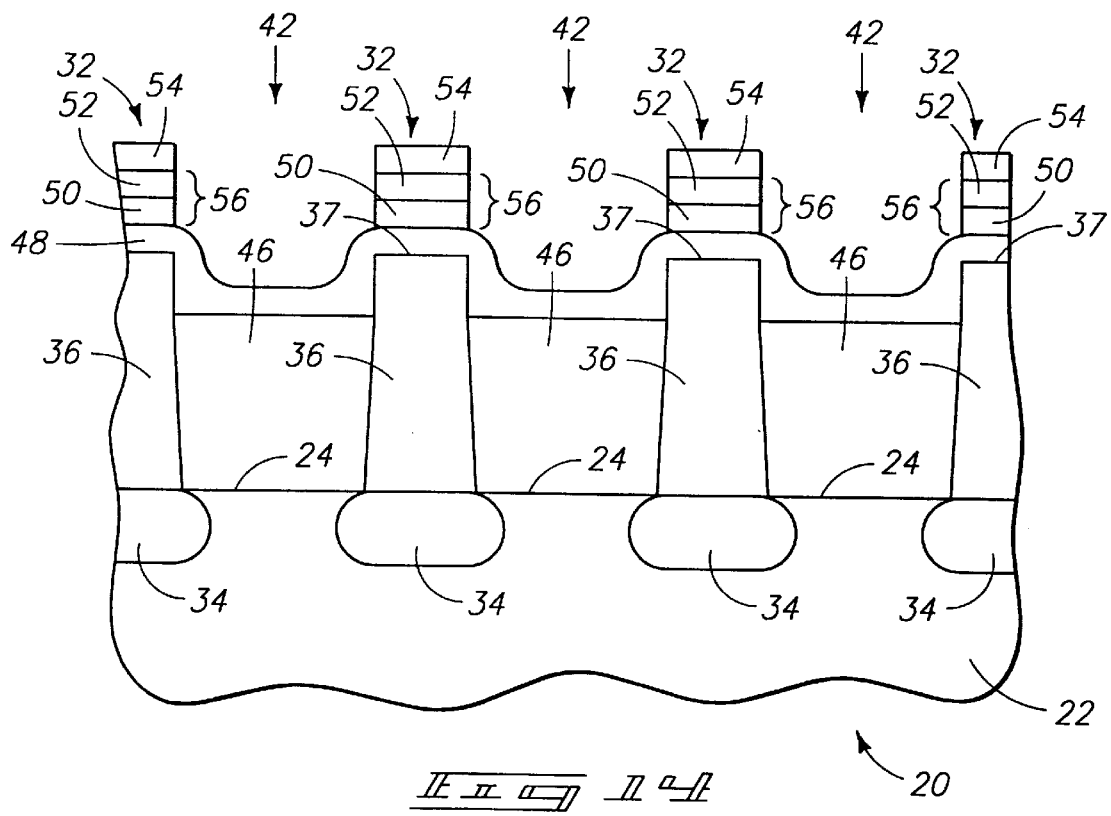
FIG. 14 is a view of the FIG. 2 wafer fragment at another processing step.

Referring to FIGS. 10 and 14, such layers are subsequently patterned and etched to define a plurality of bit lines 32 having conductive bit line portions 56 which, as shown in FIG. 10, are in electrical communication with respective plugs 46. However, as shown in FIG. 14, bit lines 32 are disposed over first insulative layer 36 and electrically insulated from the corresponding conductive plugs 46 by layer 48. Such constitutes forming a plurality of conductive bit lines over the array with individual bit lines being operably associated with individual continuous active areas and in electrical communication with individual respective plugs of conductive material within the bit line contact openings 40 (FIG. 10).

Figure 15:
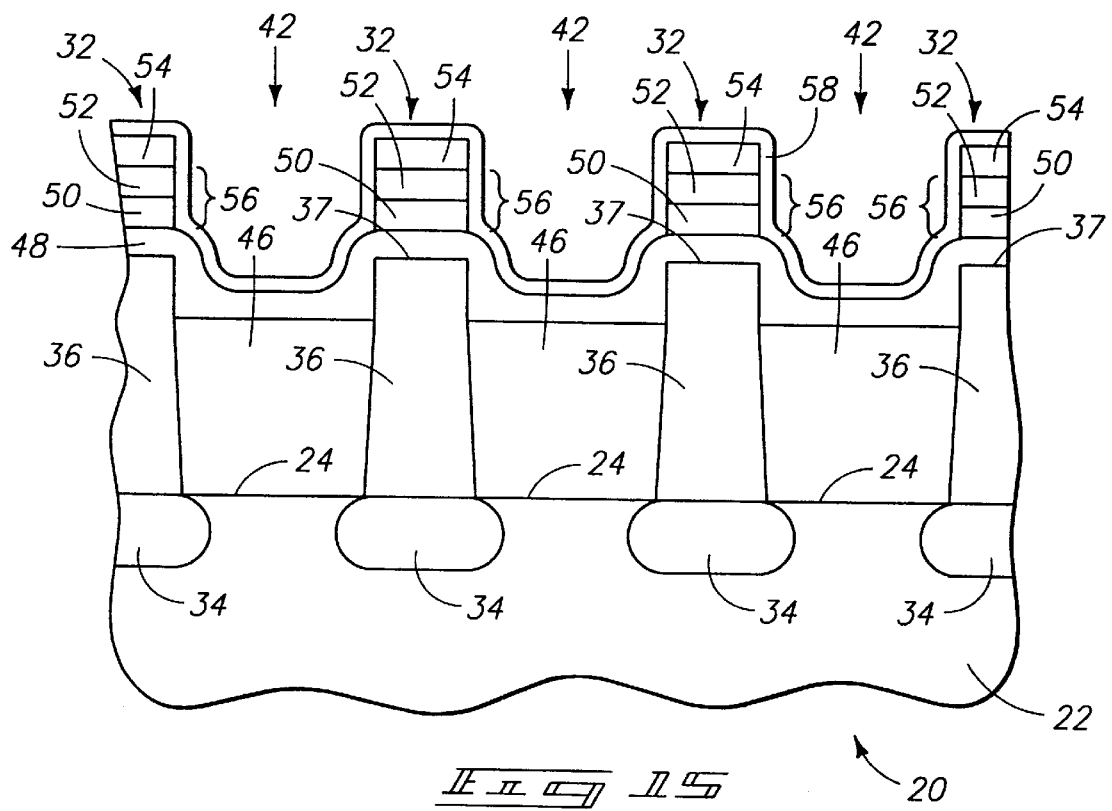
FIG. 15 is a view of the FIG. 2 wafer fragment at another processing step.

Referring to FIGS. 11 and 15, a layer 58 of insulative spacer material is formed over the substrate as shown. Such material can comprise either a suitable oxide or nitride material. In one implementation, layer 58 comprises an oxide formed through suitable decomposition of tetraethyloxysilicate (TEOS). Such effectively electrically insulates exposed conductive portions 56 of the conductive bit lines.

Figure 16:
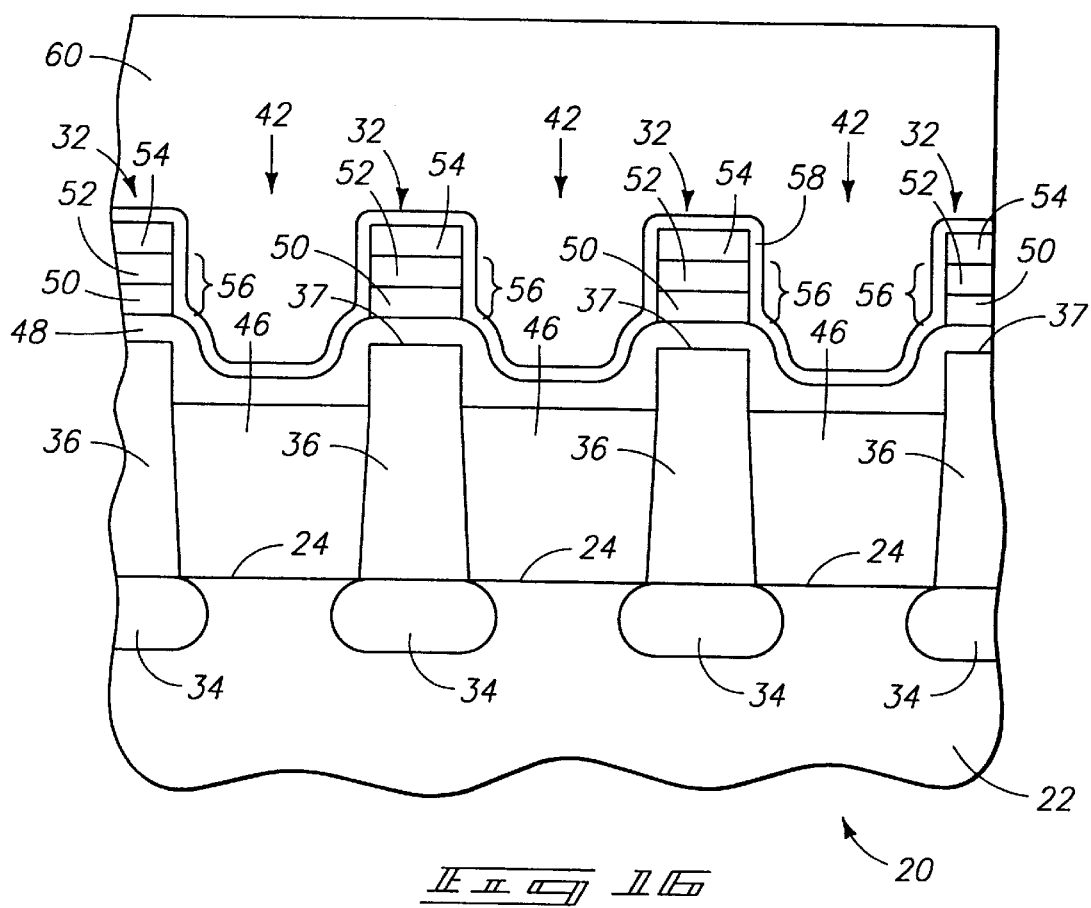
FIG. 16 is a view of the FIG. 2 wafer fragment at another processing step.

Referring to FIG. 16, a third insulative layer 60 is formed over the array. An exemplary material for layer 60 is borophosphosilicate glass (BPSG).

Figure 17:
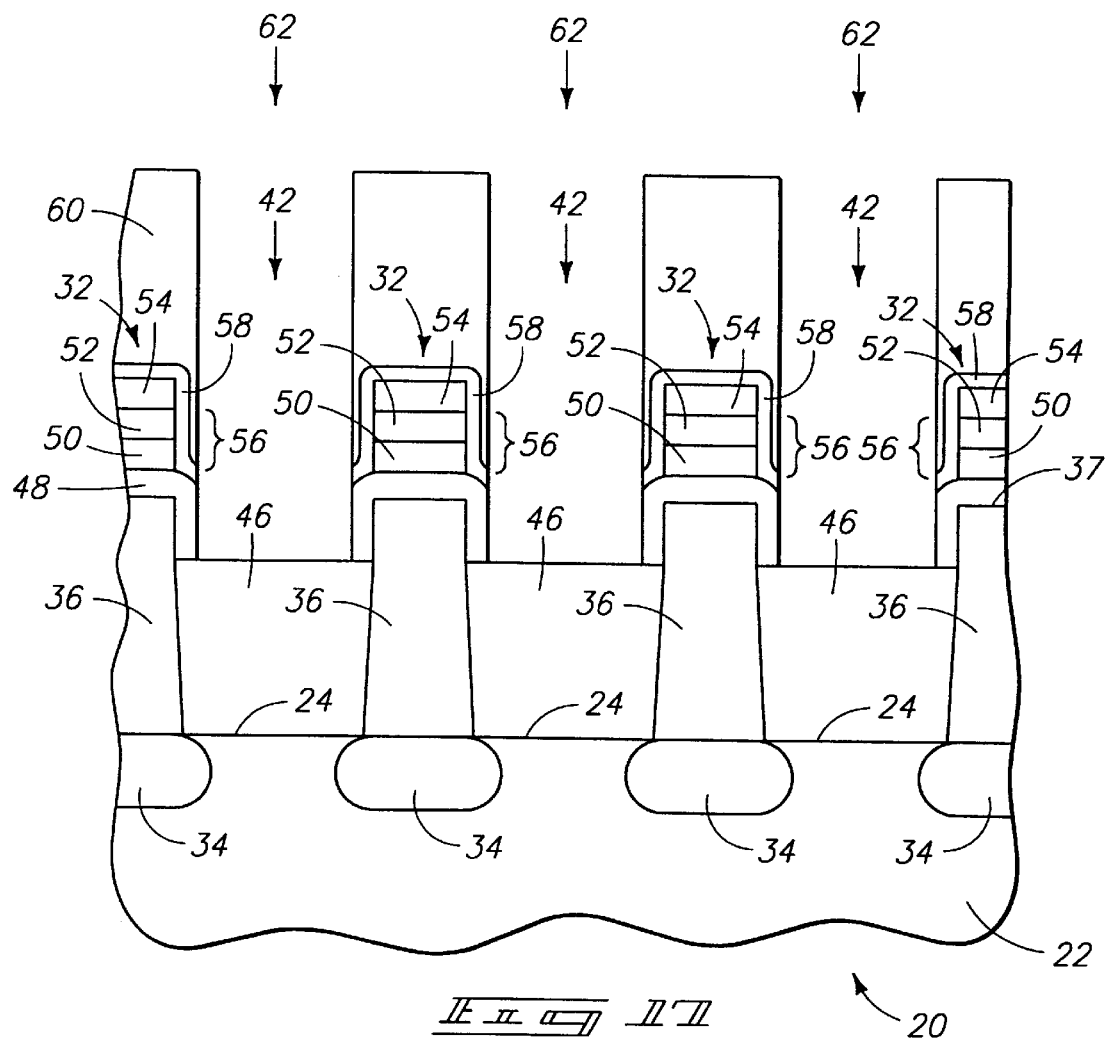
FIG. 17 is a view of the FIG. 2 wafer fragment at another processing step.

Referring to FIG. 17, layer 60 material is patterned and etched over and relative to conductive plugs 46 and capacitor contact openings 42 to expose the associated conductive plugs. Accordingly, such forms capacitor openings 62 within which capacitors are to formed.

Figure 18:
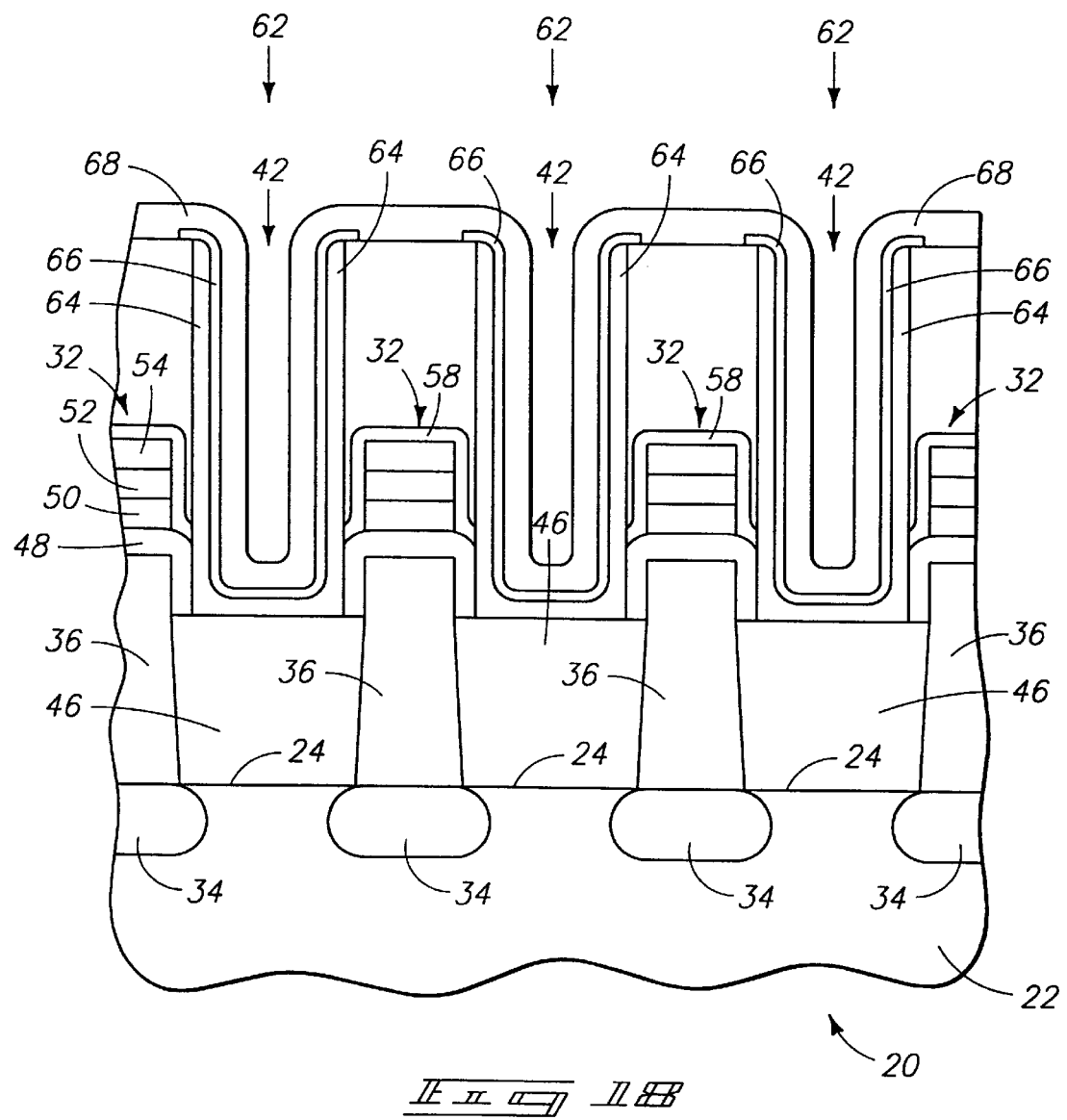
FIG. 18 is a view of the FIG. 2 wafer fragment at another processing step.

Referring to FIG. 18, individual first capacitor plate structures 64 are formed relative to and within associated capacitor openings 62. Such plate structures are in electrical communication with individual respective plugs 46. A layer 66 of dielectric material and second capacitor plate structure 68 are formed relative to and operably associated with individual first capacitor plate structures 64 to provide individual memory cells which, in accordance with the preferred embodiment, form DRAM storage capacitors.

Referring to FIG. 19, a slightly enlarged view along line 19—19 (FIG. 1) is shown. Such illustrates a view taken along one of the above-described bit lines 32. Accordingly, as shown, bit line 32 may be seen to overlie conductive lines 26, 28 and associated isolation oxide regions 34. Bit line 32 can also be seen to be in electrical communication with the two illustrated plugs 46.

The above described methodology has advantages over prior processing methods. One advantage is that both the bit line contact openings and the capacitor contact openings are patterned in a common masking step. Hence, bit line contacts and capacitor contacts can be formed at the same time. Accordingly, processing steps are reduced. Additionally, extra processing steps which were formerly necessary to remove undesired conductive material left behind after bit line formation are reduced, if not eliminated. Furthermore, bit line-to-word line capacitance is reduced.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a DRAM array comprising:
   forming a plurality of conductive lines comprising word lines and active area isolation lines over a plurality of continuous active areas formed atop a substrate;
   forming an insulative layer over the word lines and active area isolation lines;
   etching the capacitor contact openings and the bit line contact openings through the insulative layer over the continous active area; and
   forming DRAM capacitors and bit lines over the word lines and active area isolation lines.

2. The method of claim 1, further comprising patterning capacitor contact openings and bit line contact openings over the insulative layer in a common masking step and wherein etching comprises etching both the capacitor contact openings and the bit line contact openings in the same etching step.

3. The method of claim 1, wherein the insulative layer has an upper surface, and further comprising:
   forming conductive material within at least some of the capacitor contact openings and bit line contact openings;
   after the forming of the conductive material, selectively removing an amount of conductive material relative to the insulative layer and to a degree sufficient to recess the conductive material to below the insulative layer upper surface and to isolate conductive material plugs within individual associated openings.

4. The method of claim 1, wherein the insulative layer has an upper surface, and further comprising:
   forming conductive material within at least some of the capacitor contact openings and bit line contact openings;
   selectively removing an amount of the conductive material relative to the insulative layer to a degree sufficient to recess the conductive material to below the insulative layer upper surface and to isolate conductive material plugs within individual associated openings;
   forming a second insulative layer over the array;
   removing material of the second insulative layer over the bit line contact openings to expose respective conductive material plugs associated therewithin; and
   forming a plurality of conductive bit lines over the array, individual bit lines being operably associated with respective individual continuous active areas and in electrical contact with conductive material plugs within individual bit line contact openings.

5. The method of claim 1, wherein the DRAM array comprises a plurality of DRAM cells, at least some individual DRAM cells occupying substrate area which is equal to no greater than about $6F^2$, where "F" is equal to one-half of a "minimun pitch" of the DRAM array.

6. The method of claim 1, further comprising, prior to forming a plurality of conductive lines, forming the plurality of continuous active areas to not be straight throughout the array.

7. A method of forming a DRAM array comprising:

forming a plurality of conductive lines over a plurality of continuous active areas formed atop a substrate, at least some of the conductive lines constituting active area isolation lines over the continuous active areas;

etching capacitor contact openings and bit line contact openings relative to the continuous active areas;

forming a plurality of plugs comprising conductive material relative to the capacitor contact openings and the bit line contact openings, individual plugs being in electrical communication with the substrate; and forming DRAM capacitors and bit lines over the substrate, individual capacitors and individual bit lines being in electrical communication with individual respective plugs.

8. The method of claim 7, further comprising, prior to forming the plurality of plugs:

forming an insulative layer over the substrate; and etching a plurality of openings through the insulative layer to expose selected active area portions.

9. The method of claim 7, wherein forming the plurality of plugs comprises forming conductively doped polysilicon within the plurality of openings.

10. The method of claim 7, further comprising, prior to forming the plurality of plugs:

forming an insulative layer over the substrate; and etching a plurality of openings through the insulative layer to expose selected active area portions.

11. The method of claim 7, wherein forming the plurality of plugs comprises:

forming a layer comprising conductively doped polysilicon over the substrate and to within the plurality of openings; and removing an amount of polysilicon sufficient to isolate polysilicon material within the plurality of openings.

12. The method of claim 7, wherein the forming of the individual storage capacitors defines individual DRAM cells occupying respective DRAM cell areas at least some of which being equal to no greater than about $6F^2$, where "F" is equal to one-half of a "minimum pitch" of the DRAM array.

13. A method of forming an integrated circuitry memory device comprising:

forming a plurality of conductive lines over at least one continuous active area formed atop a substrate, selected individual conductive lines being configured to provide electrical isolation between adjacent portions of the at least one continuous active area;

forming insulative material over the substrate;

etching openings through the insulative material and exposing selected active area portions, the exposing defining both capacitor contact openings and bit line contact openings; and forming conductive material over the substrate, within the openings and in electrical communication with the selected active area portions.

14. The method of claim 13, further comprising:

forming at least one conductive bit line operably associated with the at least one continuous active area and which makes electrical contact with conductive material formed within the bit line contact openings; and forming individual first capacitor plate structures within respective capacitor contact openings, individual first capacitor plate structures making electrical contact with conductive material formed within the respective capacitor contact openings.

15. The method of claim 13, further comprising, after forming the conductive material:

forming a second insulative material over the substrate and conductive material; and removing second insulative material from over the bit line contact openings.

16. The method of claim 13, wherein forming conductive material comprises:

forming conductively doped polysilicon over the substrate; and removing polysilicon relative to the insulative material and to a degree sufficient to recess the polysilicon to below an adjacent insulative material upper surface.

17. The method of claim 16, further comprising:

forming a second insulative material over the substrate and the conductively doped polysilicon; and removing second insulative material from over the bit line contact openings.

18. The method of claim 14, further comprising forming dielectric material and second capacitor plate structures relative to and operably associated with individual first capacitor plate structures to provide a memory array having individual memory cells at least some of which occupying respective memory cell areas which are equal to no greater than about $6F^2$.

19. A method of forming an integrated circuitry memory device comprising:

forming a first insulative layer over an array which is supported relative to a semiconductive substrate, the array having a plurality of continuous active areas and a plurality of conductive lines operably associated therewith, at least some of the conductive lines constituting active area isolation lines over the continuous active areas, the first insulative layer having an outer surface;

forming openings in the first insulative layer to expose active area portions, the openings defining both capacitor contact openings and bit line contact openings;

forming isolated conductive material plugs over the array and within the openings, the conductive material being in electrical communication with associated active area portions;

forming a second insulative layer over the array;

removing material of the second insulative layer over the bit line contact openings to expose associated plugs of conductive material therewithin;

forming a plurality of conductive bit lines over the array, individual bit lines being operably associated with individual continuous active areas and in electrical communication with individual respective plugs of conductive material within the bit line contact openings;

forming a third insulative layer over the array; and removing material of the third insulative layer over the capacitor contact openings to expose associated plugs of conductive material therewithin.

20. The method of claim 19, further comprising forming individual first capacitor plate structures relative to respective capacitor contact openings, the first capacitor plate structures being in electrical communication with individual respective exposed plugs of conductive material within the capacitor contact openings.

21. The method of claim 19, wherein forming the openings in the first insulative layer comprises forming the openings in a common etching step.

22. The method of claim 19, wherein forming isolated conductive material plugs over the array comprises:
- forming conductively doped polysilicon over the array and within the openings formed in the first insulative layer; and
- removing some of the conductively doped polysilicon to a degree sufficient to isolate conductively doped polysilicon plugs within the openings formed in and relative to the first insulative layer.

23. The method of claim 19, wherein forming isolated conductive material plugs over the array comprises:
- forming conductively doped polysilicon over the array and within the openings formed in the first insulative layer; and
- removing some of the conductively doped polysilicon to a degree sufficient to isolate conductively doped polysilicon plugs within the openings formed in and relative to the first insulative layer by planarizing the conductively doped polysilicon.

24. The method of claim 19, wherein forming isolated conductive material plugs over the array comprises:
- forming conductively doped polysilicon over the array and within the openings formed in the first insulative layer; and
- removing some of the conductively doped polysilicon to a degree sufficient to isolate conductively doped polysilicon plugs within the openings formed in and relative to the first insulative layer by patterning and etching the conductively doped polysilicon.

25. The method of claim 19, wherein forming isolated conductive material plugs over the array comprises removing some of the conductive material to a degree sufficient to isolated conductive material plugs within the openings formed in and relative to the first insulative layer by planarizing the conductive material.

26. The method of claim 19, wherein forming isolated conductive material plugs over the array comprises removing some of the conductive material to a degree sufficient to isolate conductive material plugs within the openings formed in and relative to the first insulative layer by patterning and etching the conductive material.

27. The method of claim 19, further comprising forming dielectric material and second capacitor plate structures relative to and operably associated with individual first capacitor plate structures to provide individual memory cells at least some of which occupying respective memory cell areas which are equal to no greater than about $6F^2$.

* * * * *

UNITED STATES PATENT AND TRADEMARK OFFICE
CERTIFICATE OF CORRECTION

PATENT NO. : 6,380,026 B2
DATED : April 30, 2002
INVENTOR(S) : Kris K. Brown

It is certified that error appears in the above-identified patent and that said Letters Patent is hereby corrected as shown below:

Column 5,
Line 6, replace "An exemplary material for layer 52 is $WSi_X$." with -- An exemplary material for layer 50 is $WSi_X$. --

Column 10,
Line 9, replace "isolated conductive material plugs" with -- isolate conductive material plugs --

Signed and Sealed this

Thirty-first Day of December, 2002

JAMES E. ROGAN
*Director of the United States Patent and Trademark Office*